US006824959B2

(12) United States Patent
Olson et al.

(10) Patent No.: US 6,824,959 B2
(45) Date of Patent: Nov. 30, 2004

(54) PROCESS FOR CREATING HOLES IN POLYMERIC SUBSTRATES

(75) Inventors: Kevin C. Olson, Wexford, PA (US); Alan E. Wang, Gibsonia, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 47 days.

(21) Appl. No.: 10/183,674

(22) Filed: Jun. 27, 2002

(65) Prior Publication Data

US 2004/0000426 A1 Jan. 1, 2004

(51) Int. Cl.$^7$ ................................................. G03F 7/00
(52) U.S. Cl. ...................................... 430/313; 430/330
(58) Field of Search ........................ 430/311, 313, 430/317, 330; 216/41

(56) References Cited

U.S. PATENT DOCUMENTS

| | | | |
|---|---|---|---|
| 3,451,793 A | 6/1969 | Matsushita | 29/194 |
| 3,469,982 A | 9/1969 | Celeste | 96/35.1 |
| 3,738,835 A | 6/1973 | Bakos | 96/36 |
| 3,793,278 A | 2/1974 | DeBona | 260/29.2 EP |
| 3,833,436 A | 9/1974 | Hillis | 156/13 |
| 3,947,338 A | 3/1976 | Jerabek et al. | 204/181 |
| 3,984,299 A | 10/1976 | Jerabek | 204/181 |
| 4,238,385 A | 12/1980 | Okado et al. | 260/37 EP |
| 4,238,594 A | 12/1980 | Pampouchidis | 528/69 |
| 4,332,711 A | 6/1982 | Kooymans et al. | 523/402 |
| 4,343,885 A | 8/1982 | Reardon, Jr. | 430/177 |
| 4,352,842 A | 10/1982 | Kooymans et al. | 427/385.5 |
| 4,378,264 A | 3/1983 | Pilette et al. | 156/238 |
| 4,436,583 A | 3/1984 | Salki et al. | 156/659 |
| 4,508,749 A | 4/1985 | Brannon et al. | 427/43.1 |
| 4,592,816 A | 6/1986 | Emmons et al. | 204/180.6 |
| 4,601,906 A | 7/1986 | Shindler | 424/195.1 |
| 5,096,556 A | 3/1992 | Corrigan et al. | 204/181.7 |
| 5,134,056 A | 7/1992 | Schmidt et al. | 156/645 |
| 5,227,008 A | 7/1993 | Klun et al. | 156/630 |
| 5,229,550 A | 7/1993 | Bindra et al. | 174/262 |
| 5,242,713 A | 9/1993 | Viehbeck et al. | 427/304 |
| 5,242,780 A | 9/1993 | Lin et al. | 430/190 |
| 5,298,685 A | 3/1994 | Bindra et al. | 174/250 |
| 5,362,359 A | 11/1994 | Horikoshi et al. | 156/645 |
| 5,600,035 A | 2/1997 | Kahle, II et al. | 568/932 |
| 5,601,905 A | 2/1997 | Watanabe et al. | 428/215 |
| 6,080,526 A * | 6/2000 | Yang et al. | 430/296 |
| 6,177,357 B1 | 1/2001 | Lu | 438/745 |
| 6,266,874 B1 | 7/2001 | DiStefano | 29/846 |
| 6,303,230 B1 | 10/2001 | Watanabe et al. | 428/458 |
| 2002/0004982 A1 | 1/2002 | Haze et al. | 29/852 |

FOREIGN PATENT DOCUMENTS

| | | |
|---|---|---|
| DE | 2707405 | 1/1978 |
| EP | 0 012 463 | 6/1982 |
| EP | 0523479 A2 | 7/1992 |
| EP | 0 272 500 | 5/1993 |
| EP | 0 573 053 | 12/1993 |
| FR | 2041471 | 1/1971 |
| JP | 59133232 | 7/1984 |
| JP | 02087590 | 3/1990 |
| JP | 5320313 | 12/1993 |
| JP | 06268378 | 9/1994 |
| JP | 11071501 | 8/1997 |
| JP | 11021359 | 1/1999 |
| JP | 11145205 | 5/1999 |
| JP | 2001305750 | 11/2001 |
| WO | WO01/77753 | 10/2001 |

OTHER PUBLICATIONS

Handbook of Flexible Circuits, p. 242, 1992.
Functions of Coatings, Handbook of Polymer Coatings for Electronics, pp. 114–118, 1990.
*Polymers for Microelectronics*, Presented at the 203$^{rd}$ National Meeting of American Chemical Society, Apr., 1992, Chapter 35, pp. 507–508, by Larry F. Thompson et al, ed.
"Printed wiring boards incorporating Cu–invar–Cu layers," 802B Electronic Components & Applications, Alfred Goberecht, vol. 10 No. 1, pp. 12–16.

* cited by examiner

*Primary Examiner*—Kathleen Duda
(74) *Attorney, Agent, or Firm*—Deborah M. Altman

(57) ABSTRACT

Provided is a process for creating a via through a substrate including the steps of (a) providing a substantially void-free film of a curable composition; (b) applying a resist onto the curable film; (c) imaging the resist in predetermined locations; (d) developing the resist to expose predetermined areas of the curable film; (e) removing the exposed areas of the curable film to form holes through the curable film; and (f) heating the curable film of step (e) to a temperature and for a time sufficient to cure the curable composition. Also disclosed is a process of fabricating a circuit assembly which includes building patterned circuit layers upon a substrate that has vias provided by the aformentioned process.

43 Claims, No Drawings

PROCESS FOR CREATING HOLES IN POLYMERIC SUBSTRATES

CROSS-REFERENCE TO RELATED APPLICATIONS

This application is related to U.S. patent application Ser. No. 10/184,195; U.S. patent application Ser. No. 10/184,192; and U.S. patent application Ser. No. 10/184,387, all filed concurrently herewith.

FIELD OF THE INVENTION

The present invention relates to processes for creating holes in polymeric substrates and for fabricating a multi-layer electrical circuit assemblies.

BACKGROUND OF THE INVENTION

Electrical components, for example, resistors, transistors, and capacitors, are commonly mounted on circuit panel structures such as printed circuit boards. Circuit panels ordinarily include a generally flat sheet of dielectric material with electrical conductors disposed on a major, flat surface of the sheet, or on both major surfaces. The conductors are commonly formed from metallic materials such as copper and serve to interconnect the electrical components mounted to the board. Where the conductors are disposed on both major surfaces of the panel, the panel may have via conductors extending through holes (or "through vias") in the dielectric layer so as to interconnect the conductors on opposite surfaces. Multi-layer circuit panel assemblies have been made heretofore which incorporate multiple stacked circuit panels with additional layers of dielectric materials separating the conductors on mutually facing surfaces of adjacent panels in the stack. These multi-layer assemblies ordinarily incorporate interconnections extending between the conductors on the various circuit panels in the stack as necessary to provide the required electrical interconnections.

Polymeric films with pattened holes are useful in the manufacture of flexible circuits and various types of filters. Flexible circuits typically utilize unreinforced polymeric dielectric films on which to build circuitry levels. These circuits can conform to changing shapes and orientations by bending and twisting. The most common polymeric substrates used in flexible circuit assemblies are polyimide films such as KAPTON™ (available from E.I. DuPont de Nemours and Company), and polyester films. In double-sided flexible circuits, it is desirable to have holes extending through the polymer film (hereafter referred to as "through vias") through which electrical connections can be made between circuit patterns on opposing surfaces.

Through vias are typically fabricated by punching, etching, or photolithography of photosensitive polymers. Punching techniques have several drawbacks including possible deformation of the substrate, such as compression buckling or tearing. This technique is also unavailable to substrates that have additional layers thereon. Wet etching and plasma etching methods are commonly used to provide holes in polymeric substrates. Etching methods to date require careful selection of a limited number of resist chemistries and etchants to achieve selective removal of the desired polymeric material. Polyimide films are commonly etched by applying a concentrated basic solution, which can act on the substrate material by hydrolyzing the polymeric backbone.

U.S. Pat. No. 5,227,008 describes a method for making a flexible circuit using an aqueous processable photoresist. A fully cured polyimide film, one surface of which comprises a thin layer of copper, is laminated with a dry film photoresist. The photoresist is then exposed and developed. The exposed copper is plated to higher thickness, and the polyimide is etched with hot concentrated alkaline solution. The remaining resist is then removed with dilute basic solution to give a patterned substrate.

U.S. Pat. No. 3,833,436 describes a method for creating holes or through vias in a polyimide film. A resist is applied, exposed, developed and baked by standard methods, followed by immersion in hydrazine solution. Ultrasonic agitation is utilized to ensure adequate mixing of the etchant during the immersion step.

The above-mentioned art describes methods for creating holes or through vias that effectively depend on either mechanical means, or harsh conditions to chemically break down polymeric materials in the desired areas. As new dielectric materials are developed, new methods for handling and processing these materials are frequently necessary. In view of the prior art, there remains a need for processes that will create patterned holes in a variety of flexible polymeric substrates under mild conditions.

SUMMARY OF THE INVENTION

In one embodiment, the present invention is directed to a process for creating a via through a substrate. The process comprises the steps of (a) providing a substantially void-free film; (b) applying a resist onto the film; (c) imaging the resist in predetermined locations; (d) developing the resist to expose predetermined areas of the film; and (e) removing the exposed areas of the film to form holes through the film.

In one embodiment, the present invention is directed to a process for creating a via through a cured substrate. The process comprises the steps of: (a) providing a substantially void-free curable film comprised of a curable composition; (b) applying a resist onto the curable film; (c) imaging the resist in predetermined locations; (d) developing the resist to expose predetermined areas of the curable film; (e) removing the exposed areas of the curable film to form holes through the curable film; and (f) heating the curable film of step (e) to a temperature and for a time sufficient to cure the curable composition.

In another embodiment, the invention is directed toward a process for fabricating a multi-layer electrical circuit assembly comprising the steps of: (a) providing a substantially void-free curable film of a curable composition; (b) applying a resist onto the curable film; (c) imaging the resist in predetermined locations; (d) developing the resist to expose predetermined areas of the curable film; (e) removing the exposed areas of the curable film to form holes through the curable film; (f) heating the curable film of step (e) to a temperature and for a time sufficient to cure the curable composition; (g) stripping the remaining resist; (h) applying a layer of metal to all surfaces; (i) applying a second resist over all surfaces of the layer of metal applied in step (h); (j) imaging and developing the second resist to reveal a predetermined pattern of uncovered underlying metal; (k) etching the uncovered portions of the underlying layer of metal; (l) stripping the remaining second resist to form an electrical circuit pattern; (m) applying a dielectric composition to all surfaces; (n) providing vias in the dielectric composition in predetermined locations; (o) applying a second layer of metal to all surfaces; (p) applying a third resist to all surfaces of the second layer of metal; (q) imaging and developing the third resist to expose a predetermined pattern of the second layer of metal; (r) etching the exposed portions of the second layer of metal to form an electrical circuit pattern; (s) stripping the remaining third resist; and (t) optionally repeating steps (m) through (s) one or more times to form multiple layers of interconnecting electrical circuit patterns.

The present invention is further directed to a substrate and circuit assembly prepared by the respective aforementioned processes.

DETAILED DESCRIPTION OF THE INVENTION

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10.

As previously mentioned, in one embodiment, the present invention is directed to a process for creating a via through a substrate. In one particular embodiment, the process comprises the steps of (a) providing a substantially void-free film; (b) applying a resist onto the film; (c) imaging the resist in predetermined locations; (d) developing the resist to expose predetermined areas of the film; and (e) removing the exposed areas of the film to form holes through the film. In another embodiment, the film is curable. The process comprises the steps of: (a) providing a substantially void-free curable film of a curable composition as described below; (b) applying a resist onto the curable film; (c) imaging the resist in predetermined locations; (d) developing the resist to expose predetermined areas of the curable film; (e) removing the exposed areas of the curable film to form holes through the curable film; and (f) heating the curable film of step (e) to a temperature and for a time sufficient to cure the curable composition. The processes optionally further comprises the steps of: (g) stripping the remaining resist; and (h) applying a layer of metal to all surfaces.

It should be understood that for purposes of the processes of the present invention the formation of vias is intended to encompass the formation of "through vias" (i.e., the formation of holes extending through the substrate from one major surface to the other) to provide through connections, as well as the formation of "blind vias" (i.e., the formation of holes extending through the applied coating only to, but not through, the underlying adjacent metal layer) to provide electrical connections to, for example, ground or power. Also, for purposes of the present invention, the formation of vias extending "through the substrate" is intended to encompass the formation of through vias only. Likewise, the formation of vias extending "to the substrate" is intended to encompass the formation of blind vias only.

A film is provided that is substantially free of voids. In a particular embodiment, the film comprises a curable (i.e. uncured) composition. The film can range in thickness from 10 to 250 microns, typically 25 to 200 microns. The film can be formed by any of a variety of methods know in the art. Examples of such methods include, but are not limited to solvent casting and extrusion. Cast films are typically formed on a release substrate, which is removed in a subsequent step. The release material may be removed before or after the formation of vias in a subsequent step, described below. The film may optionally be heated to a temperature sufficient to remove any solvents and/or water from the composition. The temperature to which the film may be heated is sufficient to remove volatile liquids from the coating, but insufficient to cure the film composition in the case of a curable composition, typically between 100° C. and 130° C. The duration of the heat exposure can depend on the application method and the nature of the volatile substances, typically ranging between 1 and 10 minutes. The optional drying step may also be accomplished under ambient conditions. Of course, these ambient drying conditions require longer periods of time, and any period of time is suitable provided the time is sufficient to render the film tack-free to the touch. The film can comprise any organic polymer provided the polymer is soluble in a solution in which the resist, described in detail below, has very low or no solubility. Non-limiting examples of such polymers include polyepoxide polymers, acrylic polymers, polyester polymers, urethane polymers, silicon based polymers, polyether polymers, polyurea polymers, vinyl polymers, polyamide polymers, polyimide polymers, mixtures thereof and copolymers thereof, as described below. In one embodiment the film comprises a dielectric material. By "dielectric material" is meant a substance that is a poor conductor of electricity, but an efficient supporter of electrostatic fields, i.e. an insulator.

In one embodiment, as mentioned above, the film composition is curable. By "curable" is meant the composition is capable of thermosetting within a given temperature range and time specific to the composition being used. As used herein, a material that is "thermoset" refers to a material that solidifies or "sets" irreversibly when heated. A thermoset material has formed a crosslinked network. As used herein, a polymeric material is "crosslinked" if it at least partially forms a polymeric network. One skilled in the art will understand that the presence and degree of crosslinking (crosslink density) can be determined by a variety of methods, such as dynamic mechanical thermal analysis (DMTA) using a TA Instruments DMA 2980 analyzer conducted under nitrogen. This method determines the glass transition temperature and crosslink density of free films of coatings or polymers. These physical properties of a cured material are related to the structure of the crosslinked network. Typically the curable compositions are stable to thermosetting at ambient temperature, but capable of thermosetting at elevated temperatures further described below. For the purposes of the present invention, by "uncured" is meant the composition maintains a degree of solubility in a liquid, for example acidic solution, basic solution, or organic solvent. As referred to herein, by "basic solution" is meant a solution whose pH is greater than 7. By "acidic solution" in meant a solution whose pH is less than 7.

The curable composition provided in the form of a film can comprise any of a variety of curable compositions known to those skilled in the coatings or polymers art, provided that the composition is thermoset curable. In a particular embodiment, the curable composition comprises (a) one or more active hydrogen-containing resins, and (b) one or more curing reagents reactive with the active hydrogens of (a). A variety of active hydrogen-containing resin materials are suitable for use in the present invention, provided that the resin has a degree of solubility in acidic solution, basic solution, or organic solvent. Non-limiting examples of such resins include: polyepoxide polymers, acrylic polymers, polyester polymers, urethane polymers, silicon based polymers, polyether polymers, polyurea polymers, vinyl polymers, polyamide polymers, polyimide polymers, mixtures thereof and copolymers thereof. As used herein, by "silicon-based polymers" is meant a polymer comprising one or more —SiO— units in the backbone. Such silicon-based polymers can include hybrid polymers, such as those comprising organic polymeric blocks with one or more —SiO— units in the backbone. The resin may further comprise functional groups to impart solubility in acidic or basic solution, for example ionic groups or groups capable of forming ionic groups. Non-limiting examples of such functional groups include amines, amine salts and carboxylic acids. An example of particularly suitable compositions are halogenated ionic salt group-containing resins as described in co-pending U.S. patent application Ser. No. 10/184,195. As used herein, the term "polymer" is meant to refer to oligomers and both homopolymers and copolymers.

The active hydrogen-containing resin (a) is typically used in conjunction with one or more curing agents (b). Suitable curing agents would be those comprising groups that are reactive with the active hydrogens of resin component (a). Such curing agents include, but are not limited, to blocked polyisocyanates, carbodiimides, aziridines, epoxies, aminoplasts, active esters, and mixtures thereof. As used herein, by "active esters" is meant a non-acidic polyester of a polycarboxylic acid having more than one β-hydroxyl ester group per molecule, such as those disclosed in U.S. Pat. Nos. 4,352,842 and 4,332,711.

Mixtures of crosslinking agents (b) may also be used. In one embodiment, two crosslinking agents can be used which cure at different temperatures. One crosslinking agent may impart partial cure at ambient temperature prior to the steps leading to formation of the vias, providing a degree of integrity to the film, but leaving the coating composition soluble in acidic, basic or organic solution. The second crosslinking agent may complete the cure in a separate step at substantially higher temperatures, thus rendering the coating composition intractible.

In one embodiment, the curing agent (b) comprises an aminoplast resin. Suitable aminoplasts are known to those of ordinary skill in the art. Aminoplasts can be obtained from the condensation reaction of formaldehyde with an amine or amide. Nonlimiting examples of amines or amides include melamine, urea, or benzoguanamine. While the aldehyde used is most often formaldehyde, other aldehydes such as acetaldehyde, crotonaldehyde, and benzaldehyde can be used. The aminoplast contains imino and methylol groups and in certain instances at least a portion of the methylol groups are etherified with an alcohol to modify the cure response. Nonlimiting examples of aminoplasts include melamine-, urea-, or benzoguanamine-formaldehyde condensates, in certain instances monomeric and at least partially etherified with one or more alcohols containing from one to four carbon atoms. Nonlimiting examples of suitable aminoplast resins are commercially available, for example, from Cytec Industries, Inc. under the trademark CYMEL® and from Solutia, Inc. under the trademark RESIMENE®.

In a particular embodiment, the curing agent (b) comprises a blocked polyisocyanate. By "blocked polyisocyanate" is meant that the isocyanate groups have been reacted with a compound such that the resultant blocked isocyanate group is stable to active hydrogens at ambient temperature but reactive with active hydrogens in the resin at elevated temperatures, usually between 90° C. and 200° C. The polyisocyanates can be fully blocked as described in U.S. Pat. No. 3,984,299 column 1 lines 1 to 68, column 2 and column 3 lines 1 to 15, or partially blocked and reacted with the polymer backbone as described in U.S. Pat. No. 3,947,338 column 2 lines 65 to 68, column 3 and column 4 lines 1 to 30, which are incorporated by reference herein.

In one embodiment, the curable composition may further comprise a rheology modifier which can assist in preventing the coating from flowing into and obstructing the vias formed in a subsequent step described below. Any of a variety of the rheology modifiers well-known in the coatings art can be employed for this purpose. Examples of suitable rheology modifiers include solid inorganic fillers in finely divided form such as those described in U.S. Pat. No. 4,601,906, and microgels, for example cationic microgel such as those described in U.S. Pat. No. 5,096,556 and EP 0 272 500 B1.

A resinous photosensitive layer (i.e. "photoresist" or "resist") is applied over the film. In one embodiment, the resinous photosensitive layer is applied over the uncured film. The resinous photosensitive layer can be a positive or negative photoresist. The photoresist layer can be applied to at least a portion of the surface of the film, but typically would be applied to the entire surface of the film. The photoresist layer can have a thickness ranging from 1 to 50 microns, typically from 5 to 25 microns, and can be applied by any method known to those skilled in the photolithographic processing art.

Suitable positive-acting photosensitive resins include any of those known to practitioners skilled in the art. Examples include dinitro-benzyl functional polymers such as those disclosed in U.S. Pat. No. 5,600,035, columns 3–15. Such resins have a high degree of photosensitivity. In one embodiment, the resinous photosensitive layer is a composition comprising a dinitrobenzyl functional polymer, typically applied by roll coating.

Negative-acting photoresists include liquid or dry-film type compositions. Liquid compositions may be applied by rolling, spin coating, screen printing, immersion or curtain techniques. Examples of dry-film photoresists include those disclosed in U.S. Pat. Nos. 3,469,982, 4,378,264, and 4,343,885. Dry-film photoresists are typically laminated onto the surface such as by application of hot rollers. Dry films may be used provided the temperature and time used for lamination is insufficient to cure the film composition.

After the photosensitive layer is applied, a photo-mask having a desired pattern may be placed over the photosensitive layer and the layered substrate exposed to a sufficient level of a suitable radiation source, typically an actinic radiation source (hereafter referred to as "imaging"). As used herein, the term "sufficient level of radiation" refers to that level of radiation which polymerizes the monomers in the radiation-exposed areas in the case of negative acting resists, or which de-polymerizes the polymer or renders the polymer more soluble in the case of positive acting resists. This results in a solubility differential between the radiation-exposed and radiation-shielded areas.

The photo-mask may be removed after exposure to the radiation source and the layered substrate developed using conventional developing solutions to remove more soluble portions of the resist, and expose selected areas of the underlying uncured coating. Typical developers comprise either acidic solutions or basic solutions.

After processing (i.e. imaging and developing) the resist as described above, the exposed portion(s) of the film or uncured composition are then removed to form vias in the film or uncured composition. The solution used for removal of the film or curable film can be an acidic solution, a basic solution or an organic solvent. Compositions that can be removed with an acid solution include those polymers comprising basic groups, such as amines. A basic solution can remove compositions comprising acidic groups, such as carboxylic acids. In the step of removing the exposed areas of the film or curable composition, the solution acts by dissolving the composition, not chemically etching the polymeric backbone.

In one embodiment, the photosensitive layer is developed by applying an acidic solution, and the exposed areas of the film are removed by the action of a basic solution. In another embodiment, the photosensitive layer is developed by applying a basic solution, and the exposed areas of the film are removed by the action of an acidic solution. In another embodiment, the exposed areas of the film are capable of being removed by the action of an organic solvent. Non-limiting examples of suitable solvents include aliphatic, araliphatic and aromatic hydrocarbons and halocarbon, ethers, alcohols, ketones, and esters.

In one embodiment, where the film comprises a curable composition, the photosensitive layer is developed by applying an acidic solution, and the exposed areas of the uncured coating are removed by the action of a basic solution. In another embodiment, the photosensitive layer is developed by applying a basic solution, and the exposed areas of the uncured coating are removed by the action of an acidic solution. In yet another embodiment, the exposed areas of the uncured coating are capable of being removed by the action of the developer used for the development of the photosensitive layer. In this case, the steps of developing the resist and removing the exposed areas of the uncured coating occur simultaneously. In another embodiment, the exposed areas of the curable composition are capable of being removed by the action of an organic solvent, such as those described above.

To those skilled in the photolithographic processing art, it would be apparent that the undeveloped portions of the photosensitive layer must not be susceptible to action of the solution used to remove the film or curable composition. The removal of the exposed areas of the film or uncured composition results in a pattern of holes, or through vias, in the film composition.

In the case of a curable composition, the film is heated to cure the coating composition. It should be understood that for purposes of this invention, by "cured" is meant the coating is rendered substantially insoluble in acidic or basic solutions such as any of those described above, by a thermosetting reaction. The temperature and time required to cure the coating composition is dependant on the particular resin (a) and curing agent (b) combination described above. Cure temperatures can range from 60° C. to 220° C., typically 100° C. to 200° C. When the film is cured, the pattern of vias through the film remains intact. The cured film is of substantially uniform thickness except in locations where through vias are present. The cured film thickness is often no more than 250 microns, usually no more than 150 microns, typically no more than 50 microns, and can be no more than 20 microns. In one particular embodiment, the cured film comprises a dielectric material.

In one embodiment of the present invention the process can further comprise step (g) stripping the remaining resist. In a further embodiment, the process can be continued to form a metallized substrate, comprising the steps of: (g) stripping the remaining resist; and (h) applying a layer of metal to all surfaces. During the removal of the exposed areas of film or uncured film, the resist protects the underlying film or uncured film. The remaining resist, which is impervious to the solutions used in the removal step, may then be removed by a chemical stripping process.

In a particular embodiment in the case of a curable composition, the remaining resist is removed before the curing of the underlying coating. In an alternate embodiment, the remaining resist is removed after the underlying film has been cured. Those skilled in the art would recognize that if the exposed areas of the uncured film are capable of being removed by the action of the same developer used for the development of the resist, the step of curing the underlying film must be performed before the step of stripping the remaining resist.

Metallization is performed by applying a layer of metal to all surfaces, allowing for the formation of metallized vias through the film. Suitable metals include copper or any metal or alloy with sufficient conductive properties. The metal is typically applied by electroplating, metal vapor deposition, electroless plating, or any other suitable method known in the art to provide a uniform metal layer. The thickness of this metal layer can range from 1 to 50 microns, typically from 5 to 25 microns.

To enhance the adhesion of the metal layer to the film, prior to the metallization step all surfaces can be treated with ion beam, electron beam, corona discharge or plasma bombardment followed by application of an adhesion promoter layer to all surfaces. The adhesion promoter layer can range from 50 to 5000 Angstroms thick and typically is a metal or metal oxide selected from chromium, titanium, nickel, cobalt, cesium, iron, aluminum, copper, gold, and zinc, and oxides thereof.

In a further embodiment, the process can be continued, comprising the steps of: (i) applying a second resist over all surfaces of the layer of metal applied in step (h); (j) imaging and developing the second resist to reveal a predetermined pattern of uncovered underlying metal; (k) etching the uncovered portions of the underlying layer of metal; and (l) stripping the remaining second resist to form an electrical circuit pattern.

After metallization, a second resinous photosensitive layer (i.e. "second photoresist" or "second resist") can be applied to the metal layer. The second resist may be applied to one or both major surfaces. Optionally, prior to application of the photoresist, the metallized substrate can be cleaned and/or pretreated; e.g., treated with an acid etchant to remove oxidized metal. The second resist, as well as any of the resists used in any subsequent steps of the processes of the present invention, can be a positive or negative photoresist as described above, and may be the same as or different from the resist used above. Any of the resists described above are suitable for use as the second resist. In additional embodiments of the present invention, the resist can be electrodepositable. The photoresist layer can have a thickness ranging from 1 to 50 microns, typically from 5 to 25 microns, and can be applied by any method known to those skilled in the photolithographic processing art. Dry film resists may be used in this and any subsequent steps without restriction of laminating temperature and time. Additive or subtractive processing methods may be used to create the desired circuit patterns.

In one embodiment, a positive-acting resist comprises an electrodepositable composition comprising a dinitrobenzyl functional polyurethane and an epoxy-amine polymer such as that described in Examples 3–6 of U.S. Pat. No. 5,600,035.

In another embodiment, a liquid negative-acting resist is applied by electrodeposition, preferable cationic electrodeposition. Electrodepositable photoresist compositions comprise an ionic, polymeric material which may be cationic or anionic, and may be selected from polyesters, polyurethanes, acrylics and polyepoxides. Examples of photoresists applied by anionic electrodeposition are shown in U.S. Pat. No. 3,738,835. Photoresists applied by cationic electrodeposition are described in U.S. Pat. No. 4,592,816.

The second resist is processed (i.e. imaged and developed) as described in detail above, to yield a pattern of uncovered underlying metal. If both major surfaces comprise a layer of second resist, opposing surfaces of the layered substrate can be imaged and processed simultaneously or sequentially. The metal uncovered may then be etched using metal etchants which convert the metal to water-soluble metal complexes. The soluble complexes may be removed, for example, by water spraying.

The second resist protects the underlying metal layer during the etching step. The remaining second resist, which is impervious to the etchants, may then be removed by a chemical stripping process to provide a circuit pattern on both major surfaces connected by the metallized through vias.

In further embodiments, the process may be continued even further, comprising the steps of: (m) applying a dielectric composition to all surfaces; (n) providing holes in the dielectric composition at predetermined locations; (o) applying a second layer of metal to all surfaces; (p) applying a third resist to all surfaces of the second layer of metal; (q) imaging and developing the third resist to expose a predetermined pattern of the second layer of metal; and (r) etching the exposed portions of the second layer of metal to form an electrical circuit pattern. Optionally, the process further comprises the step (s) stripping the remaining third resist.

The dielectric composition applied to the circuitized layer can be any dielectric composition known to practitioners skilled in the art. Such a layer serves to insulate stacked layers of circuit patterns. The coating composition forms a conformal coating, i.e., covers the substrate on all surfaces, including the surfaces within any vias in and/or through the substrate. The dielectric composition can be applied by any of a variety of methods know in the coatings art. Examples of such methods include, but are not limited to screen printing, curtain coating, roll coating, immersion coating techniques, spray coating, vapor depositing, spin coating, and dry film laminating. One skilled in the art would recognize that electrodeposition as an application method would be suitable only for substrates which are electrically conductive over substantially the entire surface. Non-limiting examples of typical dielectric compositions include polyimides, epoxies, poly(paraxylylenes), polytetrafluoroethylenes, and benzocyclobutenes.

Holes, or vias, may be provided in the dielectric composition by any method known to those skilled in the art. An example of a method that provides holes is laser drilling. Holes can also be provided by photolithography provided the dielectric material is photosensitive, such as photosensitive polyimides as described in WO 01/77753. Holes may also be provided in uncured, curable coating compositions as described in copending application Ser. No. 10/184,387. Non-limiting examples of additional methods for providing holes include plasma etching, chemical etching, and mechanical drilling. Holes thus provided may extend through the dielectric to the underlying circuitized layer ("blind vias"), or through the entire layered substrate to the opposing side (thus forming "through vias").

After the formation of vias, a layer of metal can be applied to all surfaces, including the surfaces of the vias. This results in the formation of metallized vias to and/or through the substrate. Suitable metals include copper or any metal or alloy with sufficient conductive properties. The metal can be applied by any of the methods described above. The metal layer can range from 1 to 50 microns in thickness, typically from 5 to 25 microns. Preparation of the underlying dielectric layer may be performed as described above.

After metallization, a third resinous photosensitive layer (i.e. "third photoresist" or "third resist") can be applied to the metal layer. Optionally, prior to application of the photoresist, the metallized substrate can be cleaned and/or pretreated; e.g., treated with an acid etchant to remove oxidized metal. The third resist can be a positive or negative photoresist as described above, and may be the same as or different from the resists used in previous steps. Any of the resists described previously are suitable for use as the third resist.

The third resist is processed as described in detail above, to give a pattern of uncovered underlying metal. Opposing surfaces of the layered substrate can be imaged and processed simultaneously or sequentially. The metal uncovered may then be etched using metal etchants which convert the metal to water-soluble metal complexes. The soluble complexes may be removed, for example, by water spraying.

The third resist protects the underlying metal layer during the etching step. The remaining third resist, which is impervious to the etchants, may then be removed by a chemical stripping process to provide a circuit pattern on both major surfaces connected by the metallized through vias. Underlying layers of circuit patterns are connected by the metallized blind vias.

After preparation of the circuit pattern on the layered substrate, steps (m) through (t) of the process can be repeated one or more times to form a multi-layered circuit assembly. The resists used in the various steps throughout the process may also be the same as or different from those used in previous steps.

As mentioned above, the present invention is also directed to a process for fabricating a multi-layer electrical circuit assembly comprising the steps of: (a) providing a substantially void-free film of a curable composition, such as any of the curable compositions previously described; (b) applying any of the previously described resist compositions onto the curable film; (c) imaging the resist in predetermined locations using methods described above; (d) developing the resist using methods previously described to expose predetermined areas of the curable film; (e) removing the exposed areas of the curable film using any of the conditions described in detail above to form holes through the curable film; (f) heating the curable film of step (e) to a temperature and for a time sufficient to cure the curable composition as described previously; (g) stripping the remaining resist by conventional methods as mentioned above; (h) applying a layer of metal to all surfaces as described previously; (i) applying any of the aforementioned resist compositions as a second resist over all surfaces of the layer of metal applied in step (h); (j) imaging and developing the second resist using methods previously described to reveal a predetermined pattern of uncovered underlying metal; (k) etching the uncovered portions of the underlying layer of metal as previously described; (l) stripping the remaining second resist by conventional methods as mentioned above to form an electrical circuit pattern; (m) applying any of the dielectric compositions described above to all surfaces; (n) providing vias in the dielectric composition in predetermined locations using any of the methods described above; (o) applying a second layer of metal to all surfaces; (p) applying any of the aforementioned resist compositions as a third resist to all surfaces of the second layer of metal as described previously; (q) imaging and developing the third resist using methods described above to expose a predetermined pattern of the second layer of metal; (r) etching the exposed portions of the second layer of metal as previously described to form an electrical circuit pattern; (s) stripping the remaining third resist by conventional methods as mentioned above; and (t) optionally repeating steps (m) through (s) one or more times to form multiple layers of interconnecting electrical circuit patterns.

It will be appreciated by those skilled in the art that changes could be made to the embodiments described above without departing from the broad inventive concept thereof. It is understood, therefore, that this invention is not limited to the particular embodiments disclosed, but it is intended to cover modifications which are within the spirit and scope of the invention, as defined by the appended claims.

Therefore we claim:

1. A process for creating a via through a substrate comprising the following steps:
    (a) providing a substantially void-free curable film comprised of a curable composition;
    (b) applying a resist onto said curable film;
    (c) imaging said resist in predetermined locations;
    (d) developing said resist to expose predetermined areas of the curable film;
    (e) removing the exposed areas of the curable film to form holes through said curable film; and
    (f) heating the curable film of step (e) to a temperature and for a time sufficient to cure the curable composition.

2. The process of claim 1 further comprising the following steps:
    (g) stripping the remaining resist; and
    (h) optionally, applying a layer of metal to all surfaces.

3. The process of claim 2 wherein the metal applied in step (h) comprises copper.

4. The process of claim 2, further comprising the following subsequent steps:
    (i) applying a second resist over all surfaces of the layer of metal applied in step (h);
    (j) imaging and developing said second resist to reveal a predetermined pattern of uncovered underlying metal;
    (k) etching said uncovered portions of the underlying layer of metal; and
    (l) stripping the remaining second resist to form an electrical circuit pattern.

5. The process of claim 4 wherein the resist is imaged in step (j) on both major surfaces of the substrate of step (i).

6. The process of claim 4, further comprising the following subsequent steps:
    (m) applying a dielectric composition to all surfaces;
    (n) providing holes in said dielectric composition in predetermined locations;
    (o) applying a second layer of metal to all surfaces;
    (p) applying a third resist to all surfaces of said second layer of metal
    (q) imaging and developing said third resist to expose a predetermined pattern of the second layer of metal; and
    (r) etching said exposed portions of the second layer of metal to form an electrical circuit pattern.

7. The process of claim 6, further comprising the following step:
    (s) stripping the remaining third resist.

8. The process of claim 7 wherein upon completion of step (s), steps (m) through (s) are repeated one or more times to give the desired number of layers of interconnected electrical circuit patterns.

9. The process of claim 2 wherein step (f) is performed prior to step (g).

10. The process of claim 2 wherein step (g) is performed prior to step (f).

11. The process of claim 1 wherein said curable composition comprises:
    (a) one or more active hydrogen-containing resins, and
    (b) one or more curing reagents reactive with the active hydrogens of (a).

12. The process of claim 11 wherein said active hydrogen-containing resin comprises at least one polymer selected from a polyepoxide polymer, an acrylic polymer, a polyester polymer, a urethane polymer, a silicon based polymer, a polyether polymer, a polyurea polymer, a vinyl polymer, a polyamide polymer, a polyimide polymer, mixtures thereof and copolymers thereof.

13. The process of claim 11 wherein said curing agent (b) is selected from blocked isocyanates, carbodiimides, aziridines, epoxies, aminoplasts, active esters, and mixtures thereof.

14. The process of claim 1 wherein steps (d) and (e) occur simultaneously.

15. The process of claim 1 wherein the resist is developed in step (d) by applying an acidic solution, and the curable coating is removed in step (e) by applying a basic solution.

16. The process of claim 1 wherein the resist is developed in step (d) by applying a basic solution, and the curable coating is removed in step (e) by applying an acidic solution.

17. The process of claim 1 wherein the curable composition is removed in step (e) by applying an organic solvent.

18. The process of claim 1 wherein the cured composition obtained after step (f) comprises a dielectric material.

19. A process for fabricating a multi-layer electrical circuit assembly comprising the following steps:
    (a) providing a substantially void-free curable film of a curable composition;
    (b) applying a resist onto said curable film;
    (c) imaging said resist in predetermined locations;
    (d) developing said resist to expose predetermined areas of the curable film;
    (e) removing the exposed areas of the curable film to form holes through said curable film;
    (f) heating the curable film of step (e) to a temperature and for a time sufficient to cure the curable composition;
    (g) stripping the remaining resist;

(h) applying a layer of metal to all surfaces;

(i) applying a second resist over all surfaces of the layer of metal applied in step (h);

(j) imaging and developing said second resist to reveal a predetermined pattern of uncovered underlying metal;

(k) etching said uncovered portions of the underlying layer of metal;

(l) stripping the remaining second resist to form an electrical circuit pattern;

(m) applying a dielectric composition to all surfaces;

(n) providing vias in said dielectric composition in predetermined locations;

(o) applying a second layer of metal to all surfaces;

(p) applying a third resist to all surfaces of said second layer of metal;

(q) imaging and developing said third resist to expose a predetermined pattern of the second layer of metal;

(r) etching said exposed portions of the second layer of metal to form an electrical circuit pattern;

(s) stripping the remaining third resist; and (t) optionally repeating steps (n) through (t) one or more times to form multiple layers of interconnecting electrical circuit patterns.

20. The process of claim 19 wherein the metal applied in step (h) comprises copper.

21. The process of claim 19 wherein step (f) is performed prior to step (g).

22. The process of claim 19 wherein step (g) is performed prior to step (f).

23. The process of claim 19 wherein said curable composition comprises:

(a) one or more active hydrogen-containing resins, and (b) one or more curing reagents reactive with the active hydrogens of (a).

24. The process of claim 23 wherein said active hydrogen-containing resin comprises at least one polymer selected from a polyepoxide polymer, an acrylic polymer, a polyester polymer, a silicon based polymer, a urethane polymer, a polyether polymer, a polyurea polymer, a vinyl polymer, a polyamide polymer, a polyimide polymer, mixtures thereof and copolymers thereof.

25. The process of claim 23 wherein said curing agent (b) is selected from blocked isocyanates, carbodiimides, aziridines, epoxies, aminoplasts, active esters, and mixtures thereof.

26. The process of claim 19 wherein steps (d) and (e) occur simultaneously.

27. The process of claim 19 wherein the resist is developed in step (d) by applying an acidic solution, and the curable coating is removed in step (e) by applying a basic solution.

28. The process of claim 19 wherein the resist is developed in step (d) by applying a basic solution, and the curable coating is removed in step (e) by applying an acidic solution.

29. The process of claim 19 wherein the curable composition is removed in step (e) by applying an organic solvent.

30. The process of claim 19 wherein the cured composition obtained after step (f) comprises a dielectric material.

31. The process of claim 19 wherein the resist is imaged in step (j) on both major surfaces of the substrate of step (i).

32. A process for creating a via through a substrate comprising the following steps:

(a) providing a substantially void-free film;

(b) applying a resist onto said film;

(c) imaging said resist in predetermined locations;

(d) developing said resist to expose predetermined areas of the film; and (e) removing the exposed areas of the film to form holes through said film.

33. The process of claim 32 further comprising the following steps:

(g) stripping the remaining resist; and (h) optionally, applying a layer of metal to all surfaces.

34. The process of claim 33 wherein the metal applied in step (h) comprises copper.

35. The process of claim 32 wherein the resist is developed in step (d) by applying an acidic solution, and the exposed areas of the film are removed in step (e) by applying a basic solution.

36. The process of claim 32 wherein the resist is developed in step (d) by applying a basic solution, and the exposed areas of the film are removed in step (e) by applying an acidic solution.

37. The process of claim 32 wherein the exposed areas of the film are removed in step (e) by applying an organic solvent.

38. The process of claim 32 wherein the film comprises a dielectric material.

39. The process of claim 33, further comprising the following subsequent steps:

(i) applying a second resist over all surfaces of the layer of metal applied in step (h);

(j) imaging and developing said second resist to reveal a predetermined pattern of uncovered underlying metal;

(k) etching said uncovered portions of the underlying layer of metal; and (l) stripping the remaining second resist to form an electrical circuit pattern.

40. The process of claim 39 wherein the resist is imaged in step (j) on both major surfaces of the substrate of step (i).

41. The process of claim 39, further comprising the following subsequent steps:

(m) applying a dielectric composition to all surfaces;

(n) providing holes in said dielectric composition in predetermined locations;

(o) applying a second layer of metal to all surfaces;

(p) applying a third resist to all surfaces of said second layer of metal (q) imaging and developing said third resist to expose a predetermined pattern of the second layer of metal; and (r) etching said exposed portions of the second layer of metal to form an electrical circuit pattern.

42. The process of claim 41, further comprising the following step: (s) stripping the remaining third resist.

43. The process of claim 42 wherein upon completion of step (s), steps (m) through (s) are repeated one or more times to give the desired number of layers of interconnected electrical circuit patterns.

* * * * *